(12) United States Patent
Goto et al.

(10) Patent No.: US 11,894,831 B2
(45) Date of Patent: Feb. 6, 2024

(54) RESONANCE DEVICE

(71) Applicant: Murata Manufacturing Co., Ltd., Nagaokakyo (JP)

(72) Inventors: Yuichi Goto, Nagaokakyo (JP); Ryota Kawai, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 505 days.

(21) Appl. No.: 17/174,792

(22) Filed: Feb. 12, 2021

(65) Prior Publication Data

US 2021/0167751 A1 Jun. 3, 2021

Related U.S. Application Data

(63) Continuation of application No. PCT/JP2019/033731, filed on Aug. 28, 2019.

(30) Foreign Application Priority Data

Aug. 29, 2018 (JP) .................................. 2018-160026

(51) Int. Cl.
 *H03H 9/17* (2006.01)
 *H03H 15/00* (2006.01)
 (Continued)

(52) U.S. Cl.
 CPC .......... *H03H 9/17* (2013.01); *H03H 9/02433* (2013.01); *H03H 2009/02456* (2013.01); *H03H 2009/155* (2013.01); *H03H 2015/005* (2013.01)

(58) Field of Classification Search
 CPC ..... H03H 9/17; H03H 9/171; H03H 2015/005
 (Continued)

(56) References Cited

U.S. PATENT DOCUMENTS 11,108,373 B2 * 8/2021 Nishimura ......... H03H 9/02031
2011/0227450 A1 9/2011 Yamazaki
(Continued)

FOREIGN PATENT DOCUMENTS

JP 2012142665 A 7/2012
JP 2012142685 A 7/2012
(Continued)

OTHER PUBLICATIONS

International Search Report issued for PCT/JP2019/033731, dated Nov. 5, 2019.
(Continued)

*Primary Examiner* — Rakesh B Patel
(74) *Attorney, Agent, or Firm* — ArentFox Schiff LLP

(57) ABSTRACT

A resonance device is provided that includes a resonator including upper electrodes, a lower electrode, and a piezoelectric thin film formed therebetween. An upper cover is provided with a first surface facing the upper electrodes of the resonator. A power supply terminal is provided on a second surface of the upper cover with the power supply terminal electrically connected to the upper electrodes. Another power supply terminal is on the second surface of the upper cover and is electrically connected to the upper electrodes. A ground terminal is provided on the second surface of the upper cover and is electrically connected to the lower electrode. An area of each power supply terminal are different from one other such that a capacitance formed between the first power supply terminal and the ground terminal is approximately equal to a capacitance formed between the second power supply terminal and the ground terminal.

18 Claims, 11 Drawing Sheets

(51) Int. Cl.
 *H03H 9/02* (2006.01)
 *H03H 9/15* (2006.01)

(58) Field of Classification Search
 USPC .................................................. 333/186, 193
 See application file for complete search history.

(56) References Cited

U.S. PATENT DOCUMENTS

| | | |
|---|---|---|
| 2016/0329877 A1 | 11/2016 | Nishimura et al. |
| 2017/0179922 A1 | 6/2017 | Nakamura et al. |
| 2018/0034442 A1 | 2/2018 | Ishino et al. |
| 2018/0048285 A1 | 2/2018 | Goto et al. |

FOREIGN PATENT DOCUMENTS

| | | |
|---|---|---|
| JP | 2015126533 A | 7/2015 |
| WO | 2015111503 A1 | 7/2015 |
| WO | 2016063863 A1 | 4/2016 |
| WO | 2016136283 A1 | 9/2016 |
| WO | 2016159018 A1 | 10/2016 |

OTHER PUBLICATIONS

Written Opinion of the International Searching Authority issued for PCT/JP2019/033731, dated Nov. 5, 2019.

* cited by examiner

RESONANCE DEVICE

CROSS REFERENCE TO RELATED APPLICATIONS

The present application is a continuation of PCT/JP2019/033731 filed Aug. 28, 2019, which claims priority to JP Application No. 2018-160026, filed Aug. 29, 2018, the entire contents of each of which are incorporated herein by reference.

TECHNICAL FIELD

The present invention relates to resonance devices.

BACKGROUND

In general, resonance devices fabricated using Micro-Electro-Mechanical Systems (MEMS) techniques are becoming more common. Such a resonance device includes, for example, a resonator, a lower cover (lower side substrate), and an upper cover (upper side substrate).

An existing resonance device of this kind is disclosed in Patent Document 1 (identified below). This device includes a resonator including a lower electrode, a plurality of upper electrodes, and a piezoelectric film formed between the lower electrode and the plurality of upper electrodes. Moreover, an upper cover having a first surface and a second surface is provided in which the first surface is provided in such a manner as to face the upper electrodes of the resonator and seal a first surface of the resonator; a lower cover is provided having a first surface and a second surface, with the first surface being provided in such a manner as to face the lower electrode of the resonator and seal a second surface of the resonator; a power supply terminal is provided that is electrically connected to the upper electrodes; and a ground terminal is provided on the second surface of the upper cover. Moreover, the lower electrode is electrically connected to the ground terminal with the upper cover interposed therebetween.

Patent Document 1: International Publication No. 2016/159018.

As in the resonance device of the Patent Document 1, in the case where a resonance device includes two power supply terminals and one ground terminal, a stray capacitance (hereinafter, simply referred to as "capacitance") is formed both between one of the power supply terminals and the ground terminal and between the other power supply terminal and the ground terminal.

This capacitance is determined by the area of a wiring line routed inside the resonance device, the thickness of an insulating film formed on or in a substrate, and the like. Here, in the case where a resonator of the resonance device includes three or more upper electrodes, for convenience of electrode connection design, the capacitance formed between the one of the power supply terminals and the ground terminals and the capacitance formed between the other power supply terminal and the ground terminal are not in balance. In the resonator in which the capacitances are not in balance, for example, when voltage signals applied to the one of the power supply terminals and the other power supply terminal are reversed, the oscillation frequency may become different in some cases.

SUMMARY OF THE INVENTION

The exemplary embodiments of the present invention are provided in view of such circumstances. Specifically, it is an object thereof is to provide a resonance device constructed to suppress a capacitance imbalance.

Accordingly, a resonance device according to one exemplary includes a resonator including three or more upper electrodes, a lower electrode, and a piezoelectric film formed between the three or more upper electrodes and the lower electrode. Moreover; a substrate is provided in such a way that a first surface of the substrate faces the upper electrode of the resonator; a first power supply terminal is provided on a second surface of the substrate, the first power supply terminal being electrically connected to at least one of the three or more upper electrodes; a second power supply terminal is provided on the second surface of the substrate, the second power supply terminal being electrically connected to at least one of remaining upper electrodes of the three or more upper electrodes; and a ground terminal is provided on the second surface of the substrate, the ground terminal being electrically connected to the lower electrode. Moreover, an area of the first power supply terminal and an area of the second power supply terminal are different from one other in such a way that a capacitance formed between the first power supply terminal and the ground terminal is approximately equal to a capacitance formed between the second power supply terminal and the ground terminal.

According to the exemplary embodiments of the present invention, the capacitance imbalance is suppressed.

DETAILED DESCRIPTION OF EMBODIMENTS

Figure 1:
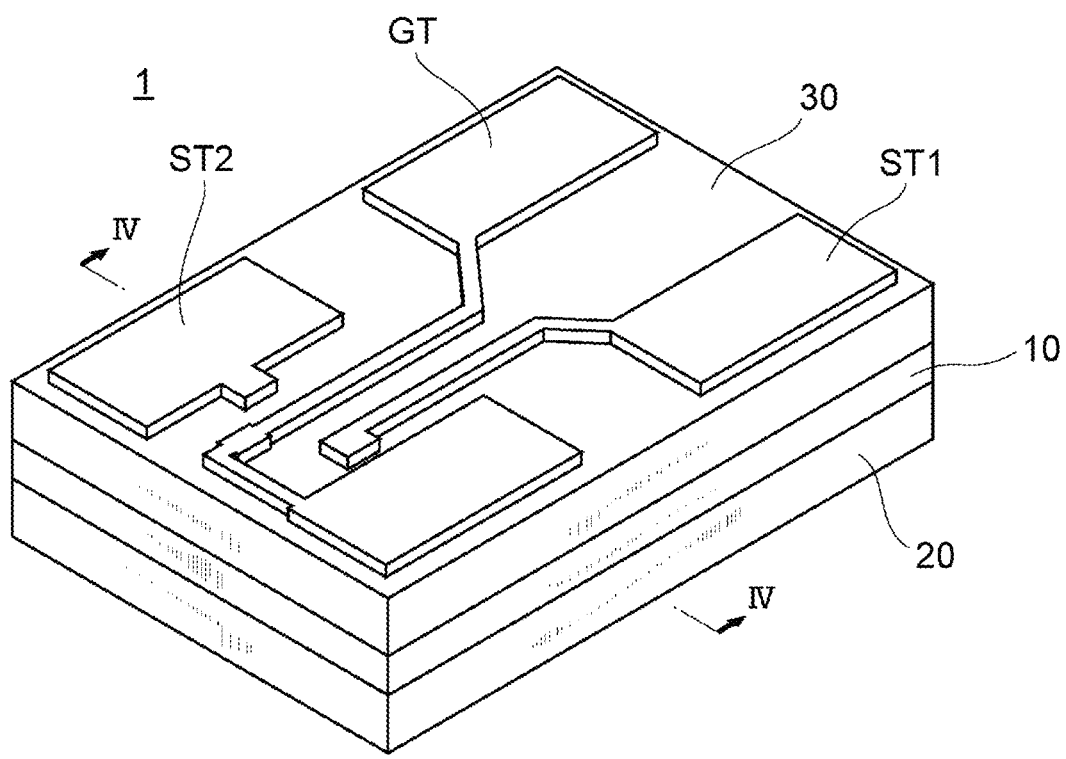
FIG. 1 is a perspective view schematically illustrating an exterior shape of a resonance device in a first exemplary embodiment.

Exemplary embodiments of the present invention are described below. In the description of the following drawings, the same or similar reference characters are used for the same or similar constituent elements. The drawings are exemplifications, and the dimensions and the shape of each portion are schematically illustrated. Thus, it should not be understood that the technical scope of the present invention is limited to these embodiments.

First Exemplary Embodiment

Figure 2:
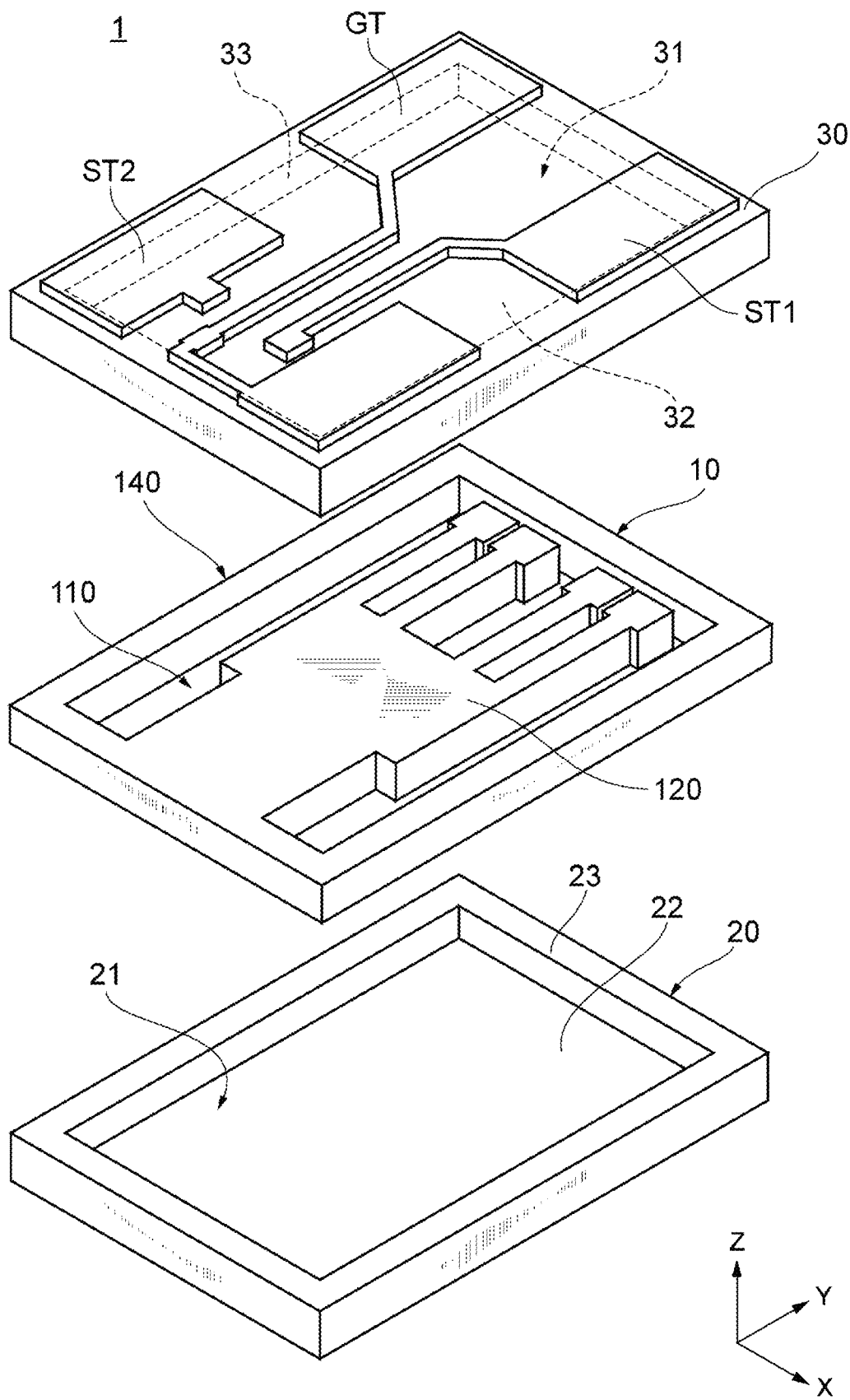
FIG. 2 is an exploded perspective view schematically illustrating a structure of the resonance device illustrated in FIG. 1.

First, referring to FIG. 1 and FIG. 2, a schematic configuration of a resonance device 1 according to the first embodiment is described. FIG. 1 is a perspective view schematically illustrating an exterior shape of the resonance device 1 in the first embodiment of the present invention. FIG. 2 is an exploded perspective view schematically illustrating the structure of the resonance device 1 illustrated in FIG. 1.

As shown, the resonance device 1 includes a resonator 10, a lower cover 20, and an upper cover 30 configured such that the lower cover 20 and the upper cover 30 form a vibration space in which the resonator 10 vibrates therein. That is to say, the resonance device 1 is formed by stacking the lower cover 20, the resonator 10, a joint part 60 which will be described later, and the upper cover 30 in this order. It is noted that the upper cover 30 corresponds to one example of a "substrate" of the present disclosure.

In the following, each element of the resonance device 1 is described. In general, it is assumed that in the resonance device 1, the side on which the upper cover 30 is provided is up (or top) and the side on which the lower cover 20 is provided is down (or back).

In an exemplary aspect, the resonator 10 is a MEMS oscillator fabricated using MEMS techniques. The resonator 10 and the upper cover 30 are joined with the joint part 60 interposed therebetween. Further, the resonator 10 and the lower cover 20 are each formed using a silicon (Si) substrate (hereinafter, referred to as "Si substrate"), for example, and these Si substrates are joined to each other. Alternatively, the resonator 10 and the lower cover 20 may be formed by using a SOI substrate, for example.

The upper cover 30 expands in a flat-plate-like manner along the X-Y plane, and a depression part 31 having, for example, a flat rectangular parallelepiped shape is formed on a back surface of the upper cover 30. The depression part 31 is surrounded by side walls 33 and forms part of the vibration space that is the space in which the resonator 10 vibrates. Alternatively, the upper cover 30 may have a flat-plate-like shape without the depression part 31. Further, a getter layer for absorbing outgassed substances can be formed on a resonator 10 side surface of the depression part 31 of the upper cover 30.

On a top surface of the upper cover 30, two power supply terminals ST1 and ST2 and a ground terminal GT are provided. The power supply terminals ST1 and ST2 are electrically connected to upper electrodes 125A, 125B, 125C, and 125D of the resonator 10, which will be described later, respectively. The ground terminal GT is electrically connected to a lower electrode 129 of the resonator 10, which will be described later.

The lower cover 20 includes a bottom plate 22 that has a rectangular flat-plate-like shape and is provided along the X-Y plane and side walls 23 that extend from a perimeter part of the bottom plate 22 in the Z-axis direction, that is, the stacking direction of the lower cover 20 and the resonator 10. In the lower cover 20, a top surface of the bottom plate 22 and inner surfaces of the side walls 23 form a depression part 21 on a surface that faces the resonator 10. The depression part 21 forms part of the vibration space of the resonator 10. Alternatively, the lower cover 20 may have a flat-plate-like shape without the depression part 21. Further, a getter layer for absorbing outgassed substances can be formed on a surface of the depression part 21 on the resonator 10 side of the lower cover 20.

Figure 3:
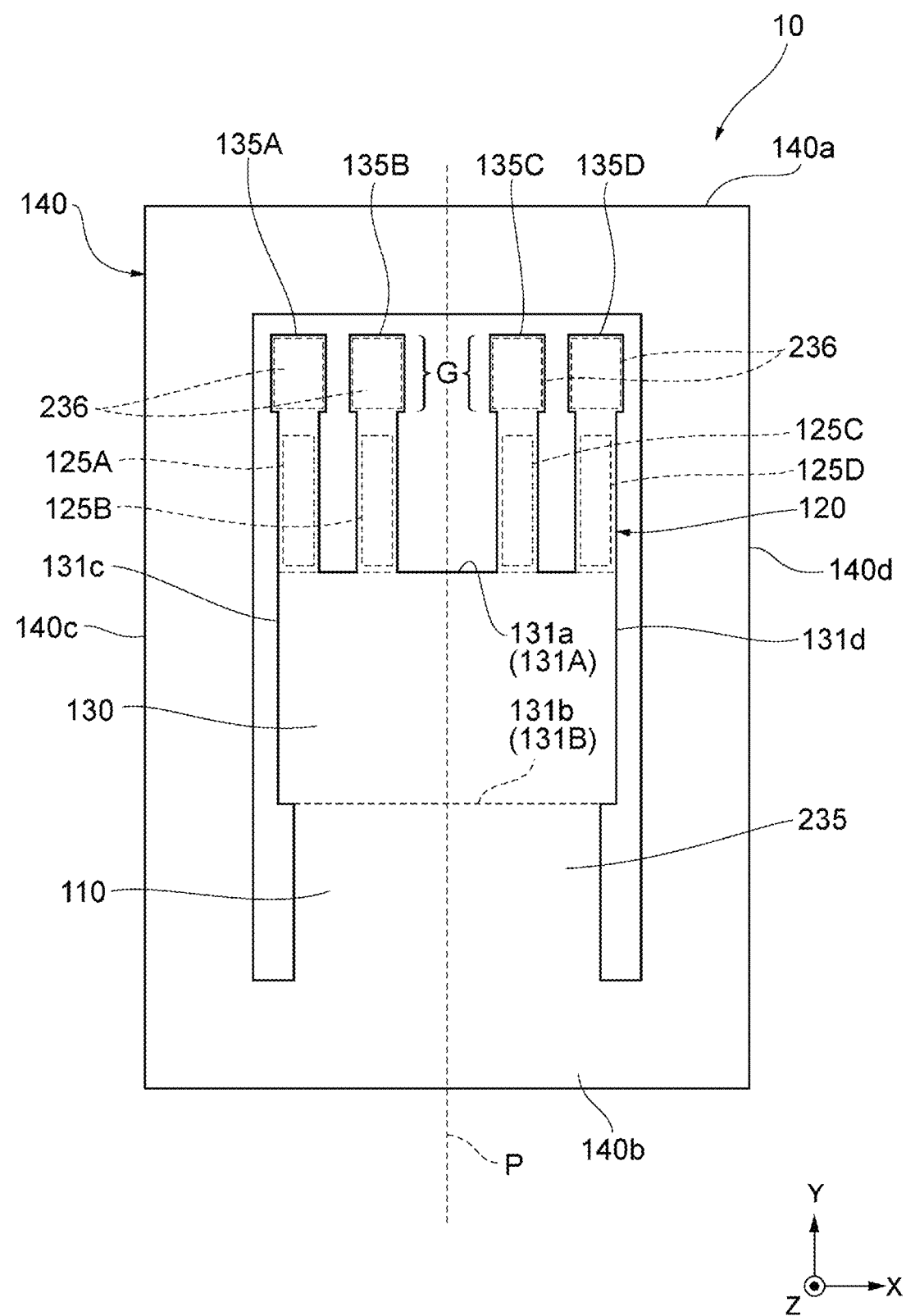
FIG. 3 is a plan view schematically illustrating a structure of a resonator illustrated in FIG. 2.

Next, referring to FIG. 3, a schematic configuration of the resonator 10 according to the first embodiment is described. FIG. 3 is a plan view schematically illustrating the structure of the resonator 10 illustrated in FIG. 2.

As illustrated in FIG. 3, the resonator 10 is a MEMS oscillator fabricated using MEMS techniques and is constructed to make out-of-plane vibration in the X-Y plane in the orthogonal coordinate system of FIG. 3. However, it is noted that the resonator 10 is not limited to the resonator that uses an out-of-plane flexural vibration mode. The resonator of the resonance device 1 may be, for example, a resonator that uses an area expansion vibration mode, a thickness expansion vibration mode, a Lamb wave vibration mode, an in-plane flexure vibration mode, or a surface acoustic wave vibration mode. These oscillators are applied to, for example, timing devices, RF filters, duplexers, ultrasonic transducers, gyro sensors, acceleration sensors, and the like. Further, the resonators may also be used for piezoelectric mirrors with actuator capability, piezoelectric gyros, piezoelectric microphones with pressure sensor capability, ultrasonic vibration sensors, and the like. Furthermore, the resonators may also be applied to electrostatic MEMS elements, electromagnetic actuation MEMS elements, and piezoresistive MEMS elements.

The resonator 10 includes a vibration part 120, a holding part 140, and a holding arm 110.

The holding part 140 (which can generally be considered a frame) is formed in a rectangular frame-like shape in such a manner as to surround the outside of the vibration part 120 along the X-Y plane. For example, the holding part 140 is formed as a single body from a rectangular column-shaped frame body. Note that the shape of the holding part 140 is not limited to a frame-like shape, as long as the holding part 140 is provided in such a manner as to surround the vibration part 120 at least partially.

The holding arm 110 is provided inside the holding part 140 and connects the vibration part 120 to the holding part 140.

The vibration part 120 is provided inside the holding part 140, and space is formed between the vibration part 120 and the holding part 140 in such a manner as to have a predetermined distance therebetween. In the example illustrated in FIG. 3, the vibration part 120 has a base part 130 and four vibration arms 135A to 135D (hereinafter, also collectively referred to as "vibration arms 135"). The vibration arms 135 contain four upper electrodes 125A to 125D (hereinafter, also collectively referred to as "upper electrodes 125"). In general, it is noted that the numbers of the vibration arms and the upper electrodes are not limited to four, and may be set to, for example, an arbitrary number greater than or equal to three. In the present embodiment, all the vibration arms 135A to 135D and the base part 130 are formed as a single body.

In the plan view, the base part 130 has long sides 131a and 131b in the X-axis direction and short sides 131c and 131d in the Y-axis direction. The long side 131a is one of sides of a front end surface (hereinafter, also referred to as "front end 131A") of the base part 130, and the long side 131b is one of sides of a back end surface (hereinafter, also referred to as "back end 131B") of the base part 130. In the base part 130, the front end 131A and the back end 131B are provided in such a manner as to face each other.

The base part 130 is connected to the vibration arms 135 at the front end 131A and is connected to the holding arm 110, which will be described later, at the back end 131B. It is noted that the base part 130 has a substantially non-square rectangular shape in the plan view in the example illustrated in FIG. 3. However, the shape of the base part 130 is not limited thereto. The base part 130 is only necessary to be formed to have approximate plane symmetry with respect to a hypothetical (or imaginary) plane P defined along a perpendicular bisector of the long side 131a. For example, the base part 130 may alternatively be a trapezoid in which the long side 131b is shorter than the long side 131a or a semicircular shape whose diameter is the long side 131a. Further, each surface of the base part 130 is not limited to a plane surface and may alternatively be a curved surface. Note that the hypothetical plane P is a plane that passes through the center of the direction along which the vibration arms 135 are lined up in the vibration part 120.

According to an exemplary aspect, in the base part 130, a base part length is about 35 μm, where the base part length is the longest distance between the front end 131A and the back end 131B in the direction from the front end 131A to the back end 131B. Further, a base part width can be about 265 μm, where the base part width is the longest distance between side ends of the base part 130 in the width direction orthogonal to the base part length direction.

The vibration arms 135 extend in the Y-axis direction and each have the same size. The vibration arms 135 are each provided between the base part 130 and the holding part 140 in parallel to the Y-axis direction. Each vibration arm 135 is connected to the front end 131A of the base part 130 at one end portion to form a fixed end, and the other end portion of the vibration arm 135 forms an open end. Further, the vibration arms 135 are provided side by side in the X-axis direction at predetermined intervals. Note that the vibration arm 135 has, for example, a width of about 50 μm in the X-axis direction and a length of about 450 μm in the Y-axis direction.

In each of the vibration arms 135, the width in the X-axis direction is wider, for example, at a part having a length of about 150 μm from the open end, compared with the other part of the vibration arm 135. This part with a wider width is referred to as a weight part G. For example, the weight part G has a width of about 70 μm in the X-axis direction and is 10 μm wider in the width in the X-axis direction at each of left and right hand sides than the other part of the vibration arm 135. The weight part G is formed as a single body by using the same process as the vibration arm 135. By forming the weight part G, the vibration arm 135 has a heavier weight per unit length on the open-end side than the fixed end side. Accordingly, by having the weight part G on the open-end side of each of the vibration arms 135, the amplitude of vertical vibration of each vibration arm can be increased.

A protective film 235, which will be described later, is formed on a top surface of the vibration part 120 (surface that faces the upper cover 30) in such a manner as to cover the whole area of the top surface. Further, a frequency adjustment film 236 is formed on a top surface of the protective film 235 at a top end portion on the open-end side of each of the vibration arms 135A to 135D. The protective film 235 and the frequency adjustment film 236 enable the adjustment of a resonant frequency of the vibration part 120.

Note that in the present embodiment, substantially the whole area of a top surface of the resonator 10 (i.e., the surface on the side facing the upper cover 30) is covered by the protective film 235. Note that the configuration of the protective film 235 is not limited to a configuration covering substantially the whole area of the resonator 10, as long as the protective film 235 covers at least the vibration arms 135.

Figure 4:
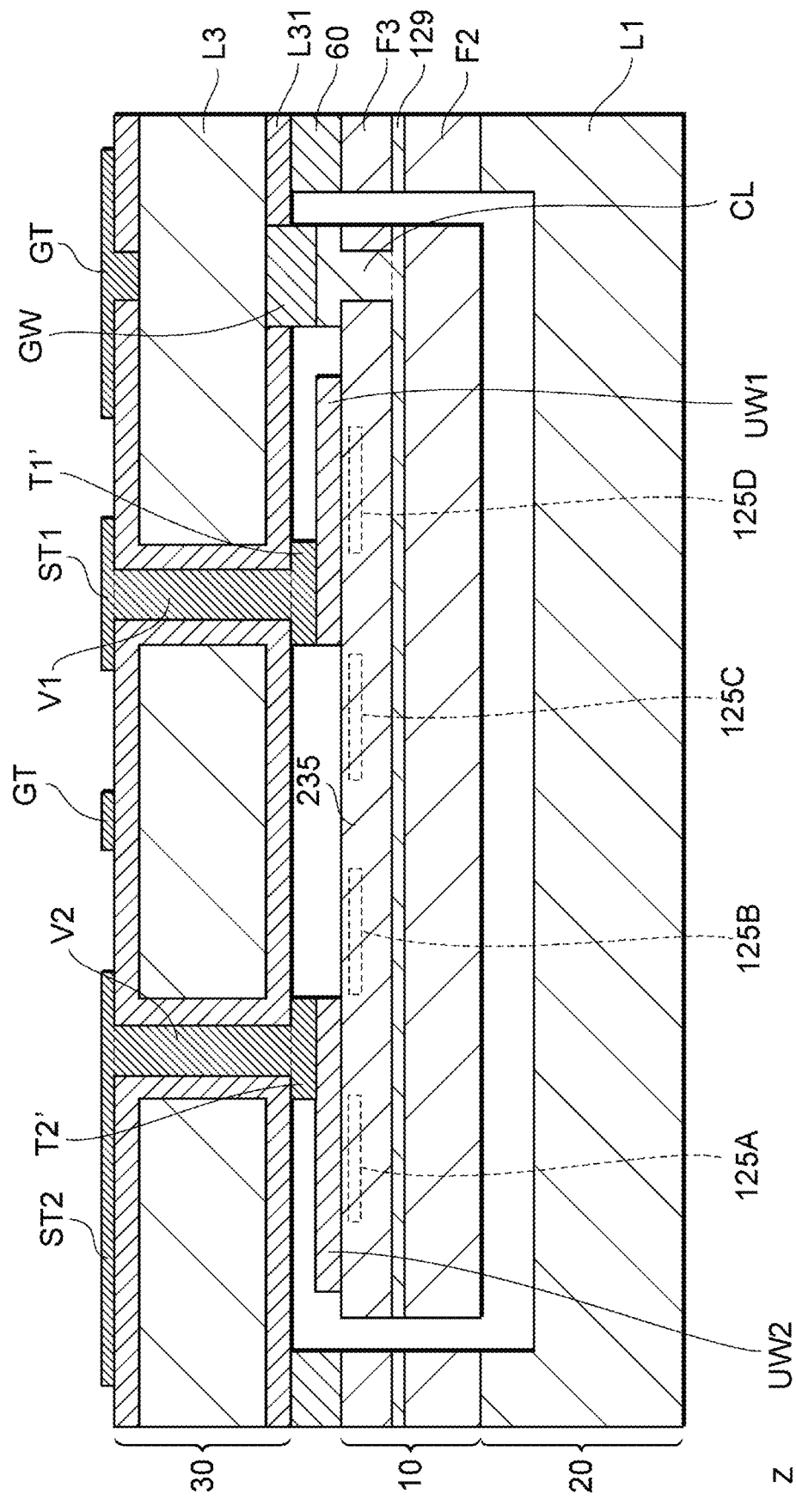
FIG. 4 is a cross-sectional view schematically illustrating a cross-sectional configuration along line IV-IV of the resonance device 1 illustrated in FIG. 1 to FIG. 3.

Next, referring to FIG. 4, a multilayer structure of the resonance device 1 according to the first embodiment of the present invention is described. FIG. 4 is a cross-sectional view schematically illustrating a cross-sectional configuration along line IV-IV of the resonance device 1 illustrated in FIG. 1 to FIG. 3.

As illustrated in FIG. 4, in the resonance device 1, the resonator 10 is joined onto the lower cover 20, and furthermore, the resonator 10 and the upper cover 30 are joined together. As described above, by holding the resonator 10 between the lower cover 20 and the upper cover 30, the lower cover 20, the upper cover 30, and the holding part 140 of the resonator 10 form the vibration space in which the vibration arms 135 vibrate.

The lower cover 20 is formed as a single body by using a silicon (Si) wafer (hereinafter, referred to as "Si wafer") L1, for example. The thickness of the lower cover 20 defined in the Z-axis direction is, for example, about 150 μm. Note that Si wafer L1 is formed using non-degenerate silicon and has a resistivity greater than or equal to 10 Ω·cm, for example.

According to an exemplary aspect, the holding part 140, the base part 130, the vibration arms 135, and the holding arm 110 of the resonator 10 are formed as a single body using the same processes. In the resonator 10, the lower electrode 129 is formed on a silicon (Si) substrate (hereinafter, referred to as "Si substrate") F2, which is one example of the substrate, in such a manner as to cover the Si substrate F2. Moreover, a piezoelectric thin film F3 is formed on the lower electrode 129 in such a manner as to cover the lower electrode 129, and the upper electrodes 125A, 125B, 125C, and 125D are stacked on the piezoelectric think film F3. Furthermore, the protective film 235 is stacked on the upper electrodes 125A, 125B, 125C, and 125D in such a manner as to cover the upper electrodes 125A, 125B, 125C, and 125D.

The Si substrate F2 is formed, for example, using a degenerate n-type silicon (Si) semiconductor having a thickness of about 6 μm and can contain phosphorus (P), arsenic (As), antimony (Sb), or the like as a n-type dopant. Moreover, the resistivity of the degenerate silicon (Si) to be used for the Si substrate F2 is, for example, less than 16 mΩ·cm and more preferably less than or equal to 1.2 mΩ·cm. Note that as one example of a temperature characteristic compensation layer, a silicon oxide (for example, $SiO_2$) layer can be formed on at least one of an upper surface and a lower surface of the Si substrate F2.

Further, the thickness of each of the lower electrode 129 and the upper electrodes 125A, 125B, 125C, and 125D is, for example, greater than or equal to about 0.1 μm and less than or equal to about 0.2 μm. The lower electrode 129 and the upper electrodes 125A, 125B, 125C, and 125D are each patterned to a desired shape by etching and the like. For the lower electrode 129 and the upper electrodes 125A, 125B, 125C, and 125D, a metal whose crystalline structure is a body-centered cubic structure is used. Specifically, the lower electrode 129 and the upper electrodes 125A, 125B, 125C, and 125D are formed using Mo (molybdenum), tungsten (W), and the like.

The piezoelectric thin film F3 is a thin film of piezoelectric substance that converts an applied voltage into a vibration. Moreover, in the exemplary aspect, the piezoelectric thin film F3 is formed using a material whose crystalline structure is wurtzite-type hexagonal crystalline structure, and a main component thereof can be a nitride or an oxide such as, for example, aluminum nitride (AlN), scandium aluminum nitride (ScAlN), zinc oxide (ZnO), gallium nitride (GaN), indium nitride (InN), or the like. Note that scandium aluminum nitride is formed by substituting part of aluminum of aluminum nitride with scandium, and instead of scandium, this part of aluminum may be substituted with two elements such as magnesium (Mg) and niobium (Nb), magnesium (Mg) and zirconium (Zr), or the like. Further, the piezoelectric thin film F3 has, for example a thickness of 1 μm. However, in one aspect, a piezoelectric thin film can also be used whose thickness is greater than or equal to about 0.2 μm and less than or equal to about 2 μm.

The piezoelectric thin film F3 expands and contracts along an in-plane direction of the X-Y plane, that is, the Y-axis direction depending on an electric field applied to the piezoelectric thin film F3 by using the lower electrode 129 and upper electrodes 125A, 125B, 125C, and 125D. This expansion and contraction of the piezoelectric thin film F3 causes displacements of the free end toward inner surfaces of the lower cover 20 and the upper cover 30 (i.e., in the Z axis direction), thereby causing the vibration arm 135 to vibrate in an out-of-plane flexural vibration mode.

In the present embodiment, the phase of the electric field applied to the upper electrodes 125A and 125D of the vibration arms 135A and 135D on the outer side and the phase of the electric field applied to the upper electrodes 125B and 125C of the vibration arms 135B and 135C on the inner side are set to be opposite to each other. This causes the vibration arms 135A and 135D on the outer side and the vibration arms 135B and 135C on the inner side to be displaced in opposite directions. For example, when the free ends of the vibration arms 135A and 135D on the outer side are displaced toward the inner surface of the upper cover 30, the free ends of the vibration arms 135B and 135C on the inner side are displaced toward the inner surface of the lower cover 20.

The protective film 235 prevents oxidation of the upper electrodes 125A, 125B, 125C, and 125D. It is preferable that the protective film 235 is formed using a material whose mass reduction speed by etching is slower than that of the frequency adjustment film 236. The mass reduction speed is expressed by the product of the etching speed, that is, the thickness to be removed per unit time and the density. The protective film 235 is formed of a piezoelectric film such as, for example, aluminum nitride (AlN), scandium aluminum nitride (ScAlN), zinc oxide (ZnO), gallium nitride (GaN), indium nitride (InN), or the like, or an insulation film such as, for example, silicon nitride (SiN), silicon oxide ($SiO_2$), aluminum oxide ($Al_2O_3$), or the like. The thickness of the protective film 235 is, for example, about 0.2 μm.

Moreover, in an exemplary aspect, the frequency adjustment film 236 is formed only on a predetermined area using processes such as etching and the like after being formed over substantially the whole area of the vibration part 120. The frequency adjustment film 236 is formed using a material whose mass reduction speed by etching is faster than that of the protective film 235. Specifically, the frequency adjustment film 236 is formed using a metal such as molybdenum (Mo), tungsten (W), gold (Au), platinum (Pt), nickel (Ni), titanium (Ti), or the like.

It is noted that the magnitude relationship between the etching speeds in the protective film 235 and the frequency adjustment film 236 is arbitrary as long as the mass reduction speeds of the protective film 235 and the frequency adjustment film 236 are in the relationship described above.

An electrically conductive layer CL is formed in such a manner as to come into contact with the lower electrode 129. Specifically, at the time of connecting the electrically conductive layer CL and the lower electrode 129, part of the piezoelectric thin film F3 stacked on the lower electrode 129 is removed to form a via in such a manner as to expose the lower electrode 129. The lower electrode 129 and the electrically conductive layer CL are connected by filling the inside of this via with a material similar to the lower electrode 129.

Upper wiring lines UW1 and UW2 are electrically connected to the upper electrodes 125A, 125B, 125C, and 125D. Specifically, the upper wiring line UW1 is electrically connected to the upper electrodes 125B and 125C of the vibration arms 135B and 135C on the inner side via lower wiring lines that are not illustrated. The upper wiring line UW2 is electrically connected to the upper electrodes 125A and 125D of the vibration arms 135A and 135D on the outer side via lower wiring lines that are not illustrated. In one aspect, the upper wiring lines UW1 and UW2 can be formed using a metal such as, for example, aluminum (Al), gold (Au), tin (Sn), or the like.

The joint part 60 is formed in a rectangular ring shape along the X-Y plane in between the resonator 10 and the upper cover 30. The joint part 60 joins the resonator 10 and the upper cover 30 in such a manner as to seal the vibration space of the resonator 10. Because of this, the vibration space is hermetically sealed, and a vacuum state is maintained.

Moreover, the joint part 60 can be formed using a metal such as, for example, aluminum (Al), germanium (Ge), an alloy formed by eutectic bonding of aluminum (Al) and germanium (Ge), or the like.

The upper cover 30 is formed using the Si wafer L3 having a predetermined thickness. The upper cover 30 is joined to the resonator 10 using the joint part 60, which will be described later, at the circumferential part of the upper cover 30 (e.g., side walls 33). It is preferable that in the upper cover 30, an upper surface on which the power supply terminals ST1 and ST2 and the ground terminal GT are provided, a lower surface that faces the resonator 10, side surfaces of penetration electrodes V1 and V2 are covered with a silicon oxide film L31. The silicon oxide film L31 is formed on a top surface of the Si wafer L3 by oxidization of the top surface of the Si wafer L3 or chemical vapor deposition (CVD), for example.

The penetration electrodes V1 and V2 are each formed by filling a through hole formed in the upper cover 30 with an electrically conductive material. The electrically conductive material to be filled is, for example, polycrystalline silicon doped with impurities (Poly-Si), copper (Cu), gold (Au), monocrystalline silicon doped with impurities, or the like. The penetration electrode V1 serves as a wiring line that electrically connects the power supply terminal ST1 and a terminal T1', and the penetration electrode V2 serves as a wiring line that electrically connects the power supply terminal ST2 and a terminal T2'.

The power supply terminals ST1 and ST2 and the ground terminal GT are formed on an upper surface of the upper cover 30 (surface on the side opposite to the surface facing the resonator 10). Further, the terminals T1' and T2' and a ground wiring line GW are formed on a lower surface of the upper cover 30 (i.e., a surface facing the resonator 10). The power supply terminal ST1, the penetration electrode V1, and the terminal T1' are electrically insulated from the Si wafer L3 by the silicon oxide film L31. On the other hand, at the time of joining the upper cover 30 and the resonator 10, by connecting the terminal T1' and the upper wiring line UW1, the power supply terminal ST1 is electrically connected to the upper wiring line UW1. As described above, the upper wiring line UW1 is electrically connected to the upper electrodes 125B and 125C, and thus the power supply terminal ST1 is electrically connected to the upper electrodes 125B and 125C of the resonator 10.

The power supply terminal ST2 is electrically connected to the upper wiring line UW2 via the penetration electrode V2 and the terminal T2'. Moreover, the power supply terminal ST2, the penetration electrode V2, and the terminal T2' are electrically insulated from the Si wafer L3 by the silicon oxide film L31. On the other hand, at the time of joining the upper cover 30 and the resonator 10, by connecting the terminal T2' and the upper wiring line UW2, the power supply terminal ST2 is electrically connected to the upper wiring line UW2. As described above, the upper wiring line UW2 is electrically connected to the upper electrodes 125A and 125D, and thus the power supply terminal ST2 is electrically connected to the upper electrodes 125A and 125D of the resonator 10.

The ground terminal GT provided on the X-axis positive direction side is formed in such a manner as to come into contact with the Si wafer L3. Specifically, part of the silicon oxide film L31 is removed by processing such as etching and the like, and the ground terminal GT is formed on the exposed Si wafer L3. Similarly, the ground wiring line GW is formed in such a manner as to come into contact with the Si wafer L3. Specifically, part of the silicon oxide film L31 is removed by processing such as etching and the like, and the ground wiring line GW is formed on the exposed Si wafer L3.

The ground terminal GT and the ground wiring line GW are formed using a metal such as, for example, gold (Au), aluminum (Al), or the like. By annealing (e.g., thermal treatment) the formed metal, ohmic contacts of the ground terminal GT and the ground wiring line GW to the Si wafer L3 are formed. This process allows the ground terminal GT and the ground wiring line GW to be electrically connected to each other via the Si wafer L3.

At the time of joining the upper cover 30 and the resonator 10, by connecting the ground wiring line GW and the electrically conductive layer CL, the ground terminal GT is electrically connected to the electrically conductive layer CL. As described above, the electrically conductive layer CL is electrically connected to the lower electrode 129, and thus the ground terminal GT is electrically connected to the lower electrode 129 of the resonator 10.

Here, a stray capacitance is formed between the power supply terminal ST1 and the ground terminal GT, and a stray capacitance is also formed between the power supply terminal ST2 and the ground terminal GT. For example, the area of a wiring line routed from the power supply terminal ST1 is different from the area of a wiring line routed from the power supply terminal ST2, and thus there is a possibility that the stray capacitance between the power supply terminal ST1 and the ground terminal GT and the stray capacitance between the power supply terminal ST2 and the ground terminal GT are not in balance.

Figure 5:
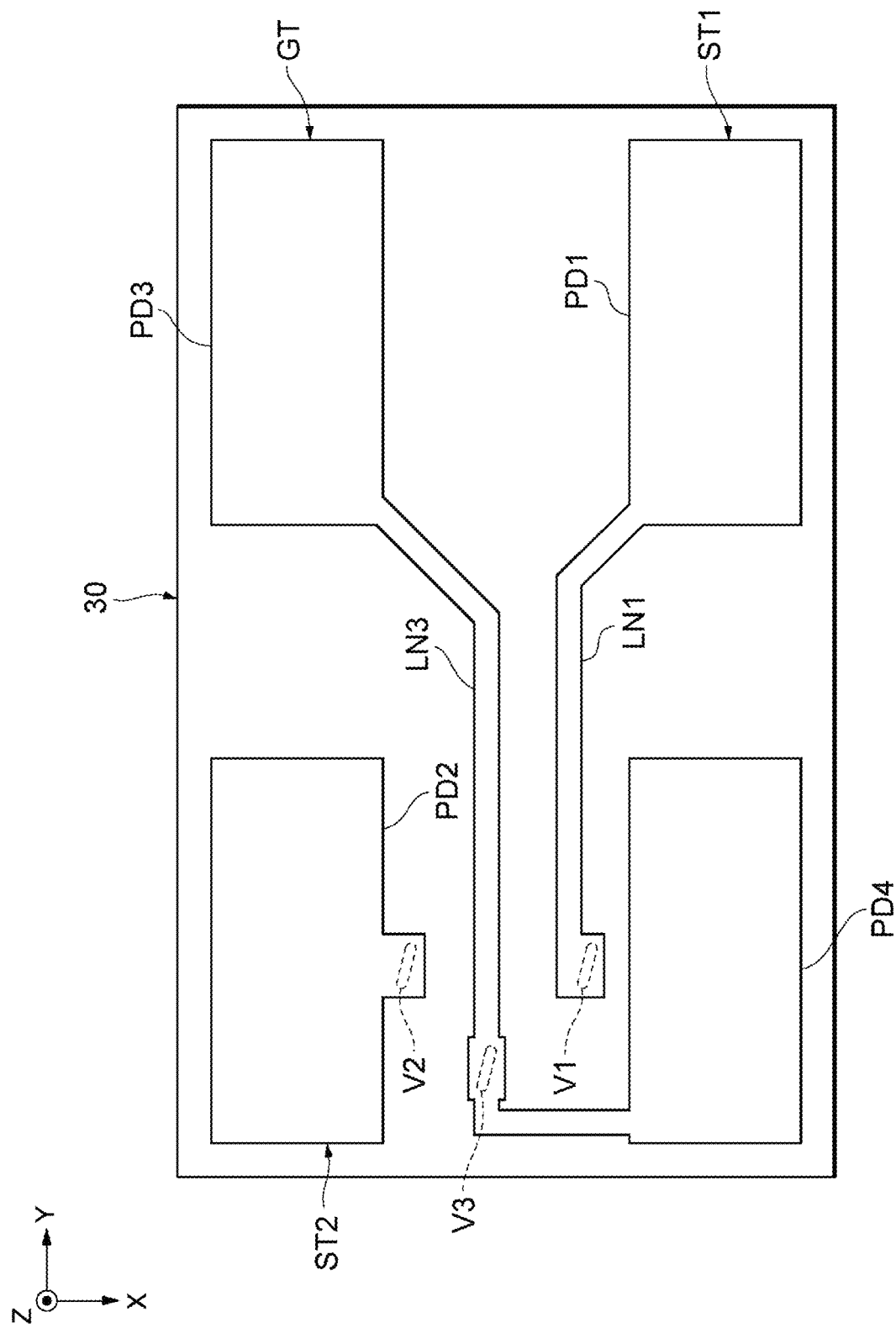
FIG. 5 is a plan view schematically illustrating structures of power supply terminals and a ground terminal provided on an upper cover illustrated in FIG. 1 and FIG. 2.

Next, referring to FIG. 5, schematic configurations of the power supply terminal ST1, the power supply terminal ST2, and the ground terminal GT according to the first embodiment are shown and described. FIG. 5 is a plan view schematically illustrating structures of the power supply terminals ST1 and ST2 and the ground terminal GT provided on the upper cover 30 illustrated in FIG. 1 and FIG. 2.

As illustrated in FIG. 5, the power supply terminal ST1 includes a power supply pad PD1 and a power supply wiring line LN1. The power supply pad PD1 is arranged on the top surface of the upper cover 30 in a corner part of the X-axis positive direction side and the Y-axis positive direction side. Further, when the top surface of the upper cover 30 is seen in a plan view (hereinafter, referred to simply as "plan view"), the power supply pad PD1 has a substantially rectangular shape. The power supply wiring line LN1 is connected to the power supply pad PD1 at one end portion (e.g., as shown as the rightmost part in FIG. 5) and extends close to a ground pad PD4, which will be described later. Further, at the other end portion of the power supply wiring line LN1 (e.g., as shown as the leftmost part in FIG. 5), the penetration electrode V1 illustrated in FIG. 4 is formed.

The power supply terminal ST2 includes a power supply pad PD2. The power supply pad PD2 is arranged on the top surface of the upper cover 30 in a corner part of the X-axis negative direction side and the Y-axis negative direction side. Further, in the plan view, the power supply pad PD2 has a substantially rectangular shape. Furthermore, the power supply pad PD2 has a part that protrudes in the X-axis positive direction. At this part, the penetration electrode V2 illustrated in FIG. 4 is formed.

The ground terminal GT includes ground pads PD3 and PD4 and a ground wiring line LN3 that connects the ground pads PD3 and PD4. On the top surface of the upper cover 30, the ground pad PD3 is arranged in a corner part of the X-axis negative direction side and the Y-axis positive direction side, and the ground pad PD4 is arranged in a corner part of the X-axis positive direction side and the Y-axis negative direction side. Further, in the plan view, the ground pads PD3 and PD4 each has a substantially rectangular shape. The ground wiring line LN3 is connected to the power supply pad PD3 at one end portion (e.g., as shown as the rightmost part in FIG. 5) and is connected to the ground pad PD4 at the other end portion (e.g., as shown as the leftmost part in FIG. 5). Further, a penetration electrode V3, which is similar to the penetration electrodes V1 and V2 illustrated in FIG. 4, is formed on the power supply wiring line LN1.

As is evident from FIG. 5, whereas the power supply terminal ST1 includes the power supply pad PD1 and the power supply wiring line LN1, the power supply terminal ST2 includes only the power supply pad PD2, and thus the areas (relative to the plan view) of the power supply terminal ST1 and the power supply terminal ST2 are different from each other. More specifically, the areas of the power supply terminal ST1 and the power supply terminal ST2 are different from each other in such a way that the capacitance formed between the power supply terminal ST1 and the ground terminal GT is approximately equal to the capacitance formed between the power supply terminal ST2 and the ground terminal GT. It is noted that the term "approximately" takes into account minor differences in the respective capacitance values due to manufacturing variances, for example. More specifically, the capacitances are approximately equal to the extent the resulting configuration reduces the absolute value of the difference between the capacitance formed between the power supply terminal ST1 and the ground terminal GT and the capacitance formed between the power supply terminal ST2 and the ground terminal GT. Accordingly, the imbalance between the capacitance formed between the power supply terminal ST1 and the ground terminal GT and the capacitance formed between the power supply terminal ST2 and the ground terminal GT can be suppressed.

Specifically, the capacitance formed between the power supply terminal ST1 and the ground terminal GT is preferably in the range from −50% to +50% of the capacitance formed between the power supply terminal ST2 and the ground terminal GT. This configuration provides a favorable oscillation, for example, even after reversing the voltage signals applied to the power supply terminal ST1 and the power supply terminal ST2.

Further, it is more preferable that the capacitance formed between the power supply terminal ST1 and the ground terminal GT is in the range from −20% to +20% of the capacitance formed between the power supply terminal ST2 and the ground terminal GT. In the present embodiment, for example, the capacitance formed between the power supply terminal ST1 and the ground terminal GT is 6.5 pF, and the capacitance formed between the power supply terminal ST2 and the ground terminal GT is 7.3 pF. This configuration provides a more favorable oscillation, for example, even after reversing the voltage signals applied to the power supply terminal ST1 and the power supply terminal ST2.

Next, modified examples of the foregoing first embodiment are described. Note that the same or similar reference characters are used for elements that are the same as or similar to those of the resonance device 1 illustrated in FIG. 1 to FIG. 5, and the descriptions thereof are omitted if appropriate. Further, similar actions and effects caused by similar constituent elements are not repeated.

First Modified Example

Figure 6:
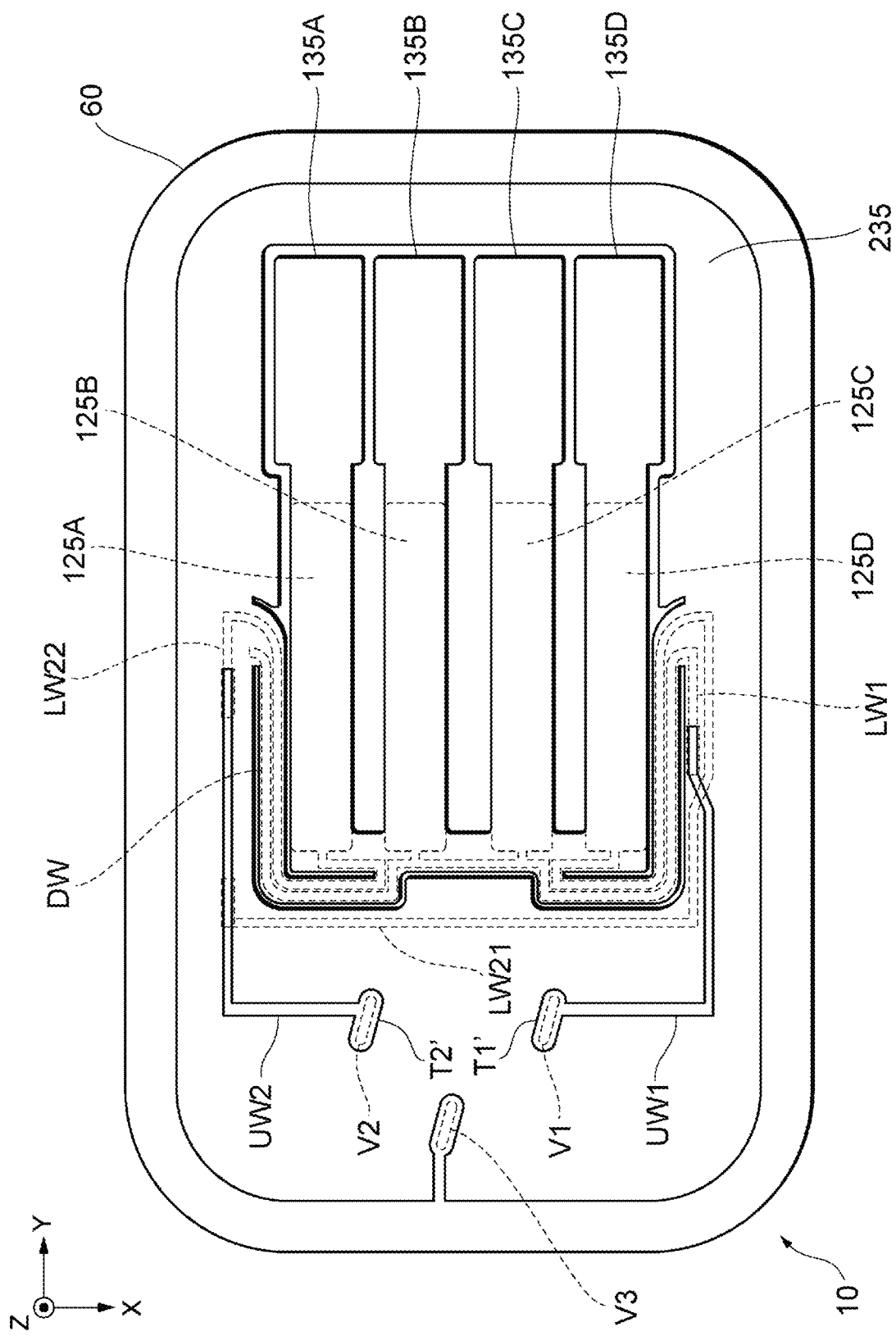
FIG. 6 is a plan view schematically illustrating the resonator and wiring lines in the vicinity of the resonator illustrated in FIG. 1 to FIG. 4.

FIG. 6 is a plan view schematically illustrating the resonator 10 and the wiring lines in the vicinity of the resonator 10 illustrated in FIG. 1 to FIG. 4.

As illustrated in FIG. 6, the terminal T1' electrically connects the penetration electrode V1 formed at the power supply terminal ST1 of the upper cover 30 and the upper wiring line UW1 formed on the protective film 235 of the resonator 10. The upper wiring line UW1 is electrically connected to a lower wiring line LW1 covered by the protective film 235. The lower wiring line LW1 is routed and electrically connected to the upper electrode 125B of the vibration arm 135B and the upper electrode 125C of the vibration arm 135C.

The terminal T2' electrically connects the penetration electrode V2 formed at the power supply terminal ST2 of the upper cover 30 and the upper wiring line UW2 formed on the protective film 235 of the resonator 10. The upper wiring line UW2 is electrically connected to lower wiring lines LW21 and LW22 covered by the protective film 235. The lower wiring line LW21 is routed and electrically connected to the upper electrode 125D of the vibration arm 135D. The lower wiring line LW22 is routed and electrically connected to the upper electrode 125A of the vibration arm 135A.

The penetration electrode V3 formed at the ground terminal GT of the upper cover 30 is connected to the joint part 60 formed in a ring-like shape on the resonator 10.

As shown in FIG. 6, the upper wiring line UW1 and the lower wiring line LW1 that electrically connect the power supply terminal ST1 to the upper electrodes 125B and 125C are different from the upper wiring line UW2 and the lower wiring lines LW21 and LW22 that electrically connect the power supply terminal ST2 to the upper electrodes 125A and 125D in the routing length (i.e., the distance), and therefore are different in the area.

In the first modified example, the lower wiring line LW1 includes a dummy wiring line DW. In this embodiment, the dummy wiring line DW is not for electrical connection, but for increasing the area of the lower wiring line LW1 while making symmetry with the lower wiring line LW1. This configuration maintains symmetry of vibrations of the vibration arms 135 and also enables adjusting the imbalance among the capacitances formed by the areas of the upper wiring line UW1, the lower wiring LW1, the upper wiring line UW2, and the lower wiring lines LW21 and LW22 by using the area of the dummy wiring line DW.

Second Modified Example

Figure 7:
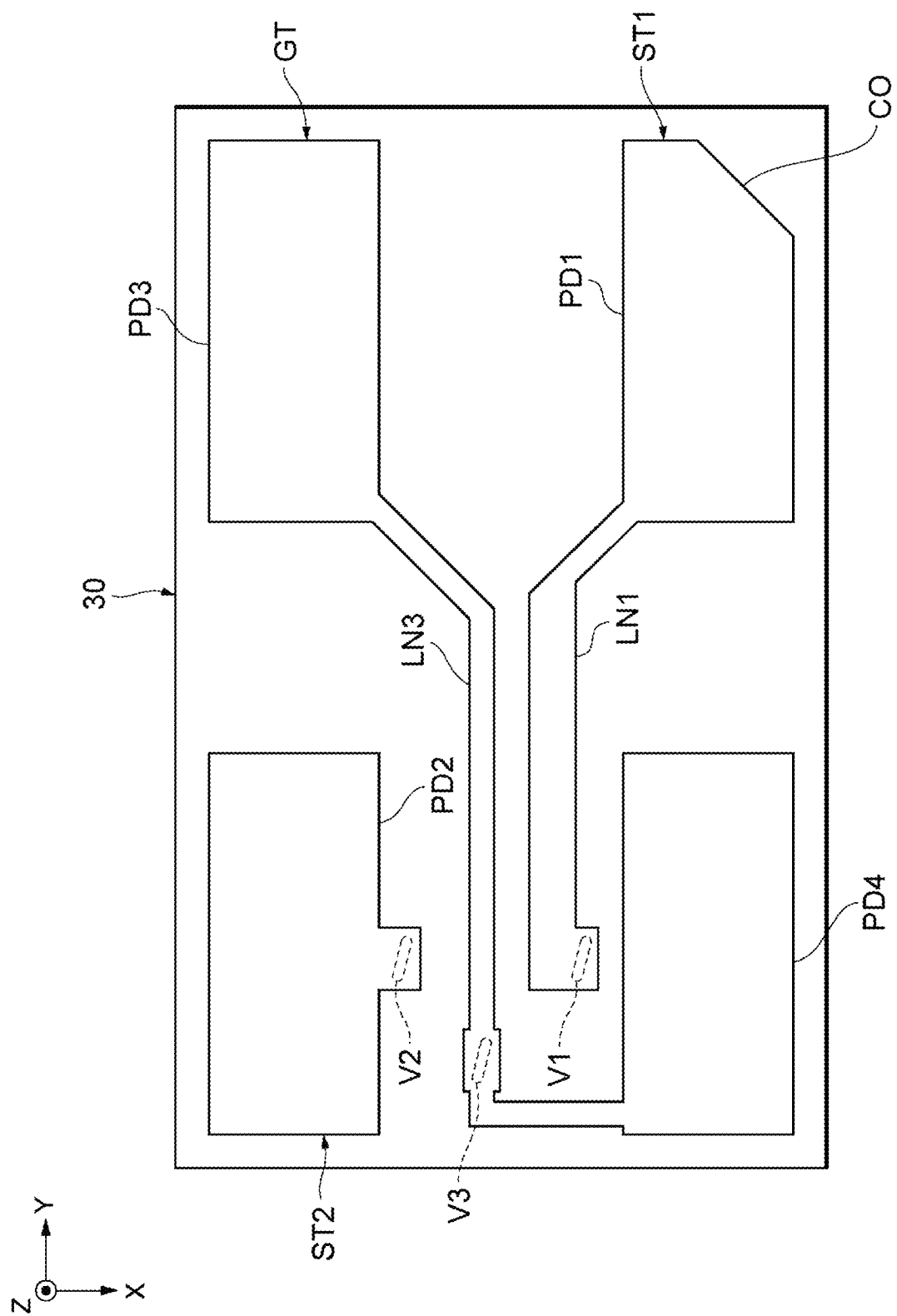
FIG. 7 is a plan view of a modified example schematically illustrating structures of the power supply terminals and the ground terminal provided on the upper cover illustrated in FIG. 5.

FIG. 7 is a plan view of a modified example schematically illustrating structures of the power supply terminals ST1 and ST2 and the ground terminal GT provided on the upper cover 30 illustrated in FIG. 5.

As illustrated in FIG. 7, the power supply terminal ST1 is different from the power supply terminal ST1 illustrated in FIG. 5 in the shape of the power supply pad PD1 and the line width of the power supply wiring line LN1.

Specifically, in the plan view, while the power supply pad PD2 of the power supply terminal ST2 has a substantially rectangular shape, the power supply pad PD1 of the power supply terminal ST1 has a shape including a cut part (or chamfered portion) CO. In this way, because of the difference between the shape of the power supply terminal ST1 and the shape of the power supply terminal ST2, it becomes possible to provide a configuration in which the power supply terminal ST1 and the power supply terminal ST2 have different areas.

Further, while the power supply terminal ST2 includes only the power supply pad PD2, the power supply terminal ST1 includes the power supply wiring line LN1 in addition to the power supply pad PD1, and the line width of the power supply wiring line LN1 is wider than the one illustrated in FIG. 5. In this way, because of the difference between the width of the power supply terminal ST1 and the width of the power supply terminal ST2, it becomes also possible to provide the power supply terminal ST1 and the power supply terminal ST2 to have different areas.

Alternatively, instead of the shape and the width, or in addition to the shape and the width, the length (i.e., the distance) of the power supply terminal ST1 and the length (i.e., the distance) of the power supply terminal ST2 may be different from each other. This configuration also facilitates the realization of the power supply terminal ST1 and the power supply terminal ST2 that have different areas.

Second Exemplary Embodiment

Figure 8:
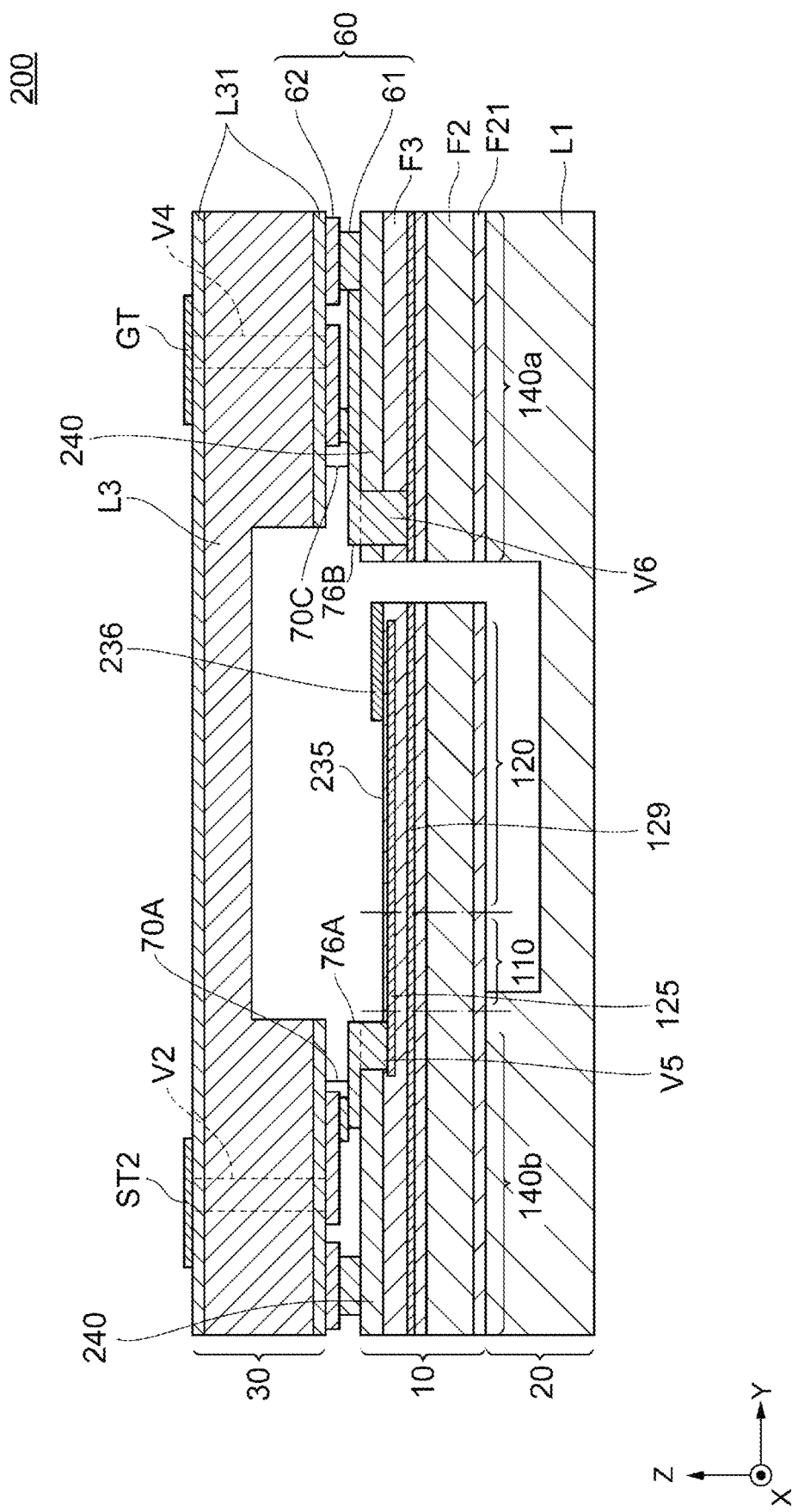
FIG. 8 is a cross-sectional view schematically illustrating a structure of a resonance device according to a second exemplary embodiment.

Next, referring to FIG. 8, a resonance device according to the second embodiment is described. Note that in the following embodiments, the same or similar reference characters are used for constituent elements that are the same as or similar to those of the first embodiment, and the difference from the first embodiment is described.

Further, similar actions and their effects caused by similar constituent elements are not repeated.

FIG. 8 is a cross-sectional view schematically illustrating the structure of a resonance device 200 according to the second embodiment. Note that FIG. 8 is a cross-sectional view along the Y-axis of the resonance device 200.

The resonance device 200 of the second embodiment is different from the resonance device 1 of the first embodiment in that a first metal layer 61 of the joint part 60 and the lower electrode 129 are electrically connected to each other.

As illustrated in FIG. 8, the power supply terminal ST2 and the upper electrode 125 are electrically connected to each other via the penetration electrode V2, a connection wiring line 70A, and a contact electrode 76A. Note that although it is not illustrated in FIG. 8, the power supply terminal ST1 and the penetration electrode V1 illustrated in FIG. 4 are similarly formed. On the other hand, the ground terminal GT and the lower electrode 129 are electrically connected to each other via a penetration electrode V4, a connection wiring line 70C, and a contact electrode 76B. The penetration electrode V4 is formed in the upper cover 30 as is the case with the penetration electrodes V1 and V2.

As shown, a stray capacitance reduction film 240 is stacked on the protective film 235. The stray capacitance reduction film 240 is composed of tetraethyl orthosilicate (TEOS). The thickness of the stray capacitance reduction film 240 is about 1 μm. The stray capacitance reduction film 240 reduces a stray capacitance in a wiring line routing part and also serves as an insulation layer when wiring lines having different electrical potentials cross over and a capability of serving as a standoff structure for expanding the vibration space.

On the lower surface of the Si substrate F2, as one example of the temperature characteristic compensation layer, for example, a silicon oxide layer F21 that is silicon dioxide ($SiO_2$) is formed. This enables the improvement of the temperature characteristic. Alternatively, the silicon oxide layer F21 may be formed on the upper surface of the Si substrate F2 or may be formed on both the upper surface and the lower surface of the Si substrate F2.

The joint part 60 includes the first metal layer 61 formed on the resonator 10 and a second metal layer 62 formed on the upper cover 30 and joins the resonator 10 and the upper cover 30 together by eutectic bonding of the first metal layer 61 and the second metal layer 62. The first metal layer 61 is, for example, a layer whose main component is aluminum (Al), and the second metal layer 62 is, for example, a layer whose main component is germanium (Ge).

Note that in the example illustrated in FIG. 8, the first metal layer 61 and the second metal layer 62 are each illustrated as an independent layer. However, in practice, eutectic bonding is formed at the interface between the first metal layer 61 and the second metal layer 62. That is to say, the joint part 60 is formed in such a way that a main component of the joint part 60 is formed as a eutectic alloy of a first metal whose main component is aluminum (Al) and a second metal whose main component is germanium (Ge).

The connection wiring line 70A is electrically connected to the power supply terminal ST2 via the penetration electrode V2 and is also electrically connected to the contact electrode 76A. Further, the connection wiring line 70C is electrically connected to the ground terminal GT via the penetration electrode V4 and is also electrically connected to the contact electrode 76B.

The contact electrode 76A is formed to contact the upper electrode 125 of the resonator 10 and electrically connects the connection wiring line 70A and the resonator 10. Specifically, at the time of connecting the contact electrode 76A and the upper electrode 125, parts of the stray capacitance reduction film 240 and the protective film 235 stacked on the upper electrode 125 are removed to form a via V5 in such a manner as to expose the upper electrode 125. The upper electrode 125 and the contact electrode 76A are connected by filling the inside of the formed via V5 with a material similar to the contact electrode 76A. The contact electrode 76B is formed in such a manner as to come into contact with the lower electrode 129 of the resonator 10 and electrically connects the connection wiring line 70C and the resonator 10. Specifically, at the time of connecting the contact electrode 76B and the lower electrode 129, parts of the stray capacitance reduction film 240 and the piezoelectric thin film F3 stacked on the lower electrode 129 are removed to form a via V6 in such a manner as to expose the lower electrode 129. The lower electrode 129 and the contact electrode 76B are connected by filling the inside of the formed via V6 with a material similar to the contact electrode 76B. The contact electrodes 76A and 76B are formed using a metal such as, for example, aluminum (Al), gold (Au), tin (Sn), or the like. Note that a connecting part of the upper electrode 125 and the contact electrode 76A and a connecting part of the lower electrode 129 and the contact electrode 76B are preferably located in an area outside of the vibration part 120. In the present embodiment, the upper electrode 125 and the contact electrode 76A and the lower electrode 129 and the contact electrode 76B are connected at the holding part 140.

Further, the contact electrode 76B extends over the stray capacitance reduction film 240 and is connected to the first metal layer 61 formed at an outer perimeter part of the resonator 10. Alternatively, the contact electrode 76B and the first metal layer 61 may be formed on the stray capacitance reduction film 240 as a single body. In this way, the first metal layer 61 of the joint part 60 is electrically connected to the lower electrode 129 via the contact electrode 76B. Because of this configuration, the joint part 60 and the lower electrode 129 are short-circuited, and thus it becomes possible to cancel a stray capacitance that can be formed due to the piezoelectric thin film F3 or the stray capacitance reduction film 240 arranged between the joint part 60 and the lower electrode 129. As a result, although it becomes more susceptible to the capacitance imbalance, as described above, influences caused by the capacitance imbalance can be suppressed by making the area of the power supply terminal ST1 and the area of the power supply terminal ST2 different from each other in such a way that the capacitance formed between the power supply terminal ST1 and the ground terminal GT is approximately equal to the capacitance formed between the power supply terminal ST2 and the ground terminal GT.

Third Exemplary Embodiment

Figure 9:
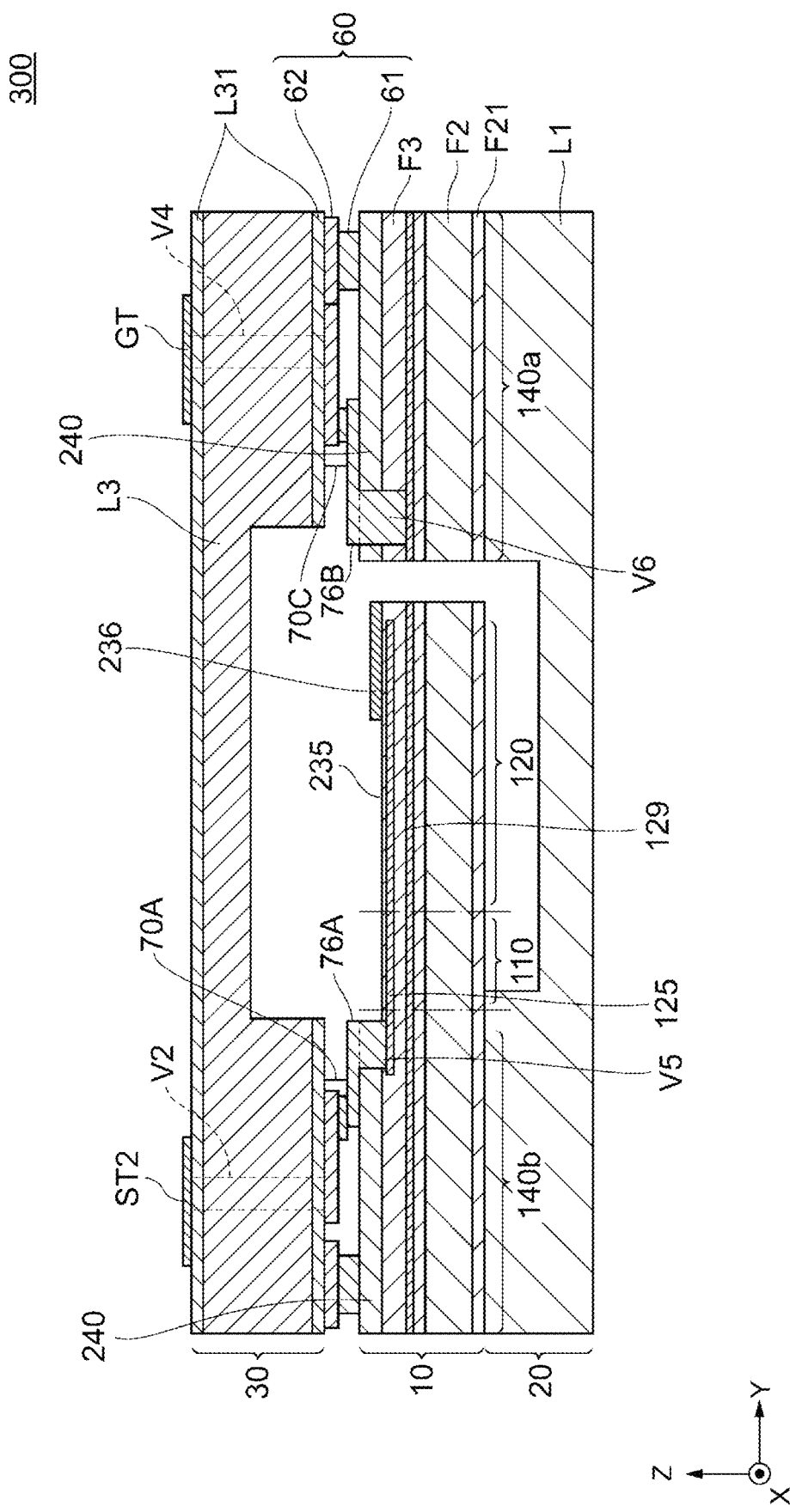
FIG. 9 is a cross-sectional view schematically illustrating a structure of a resonance device according to a third exemplary embodiment.

Next, referring to FIG. 9, a resonance device according to the third embodiment is described. Note that in each of the following embodiments, the same or similar reference characters are used for constituent elements that are the same as or similar to those of the first embodiment or the second embodiment, and the difference from the first embodiment and the second embodiment is described. Further, similar actions and effects caused by similar constituent elements are not repeated.

FIG. 9 is a cross-sectional view schematically illustrating a structure of a resonance device 300 according to the third embodiment. Note that FIG. 9 is a cross-sectional view along the Y-axis of the resonance device 300.

The resonance device 300 of the third embodiment is different from the resonance device 1 of the first embodiment and the resonance device 200 of the second embodiment in that the second metal layer 62 of the joint part 60 is electrically connected to the lower electrode 129.

As illustrated in FIG. 9, the contact electrode 76B of the resonance device 300 is not connected to the first metal layer 61, which is different from the resonance device 200 of the second embodiment illustrated in FIG. 8.

On the other hand, part of the connection wiring line 70C is connected to the second metal layer 62 that is formed at an outer perimeter part of the upper cover 30 and extends over the silicon oxide film L31 formed on the lower surface of the upper cover 30. Alternatively, the part of the connection wiring line 70C and the second metal layer 62 may be formed on the stray capacitance reduction film 240 as a single body. In this way, the second metal layer 62 of the joint part 60 is electrically connected to the lower electrode 129 via the connection wiring line 70C and the contact electrode 76B. Because of this configuration, as is the case with the second embodiment, it becomes possible to cancel a stray capacitance that can be formed due to the piezoelectric thin film F3 or the stray capacitance reduction film 240 arranged between the joint part 60 and the lower electrode 129.

Fourth Exemplary Embodiment

Figure 10:
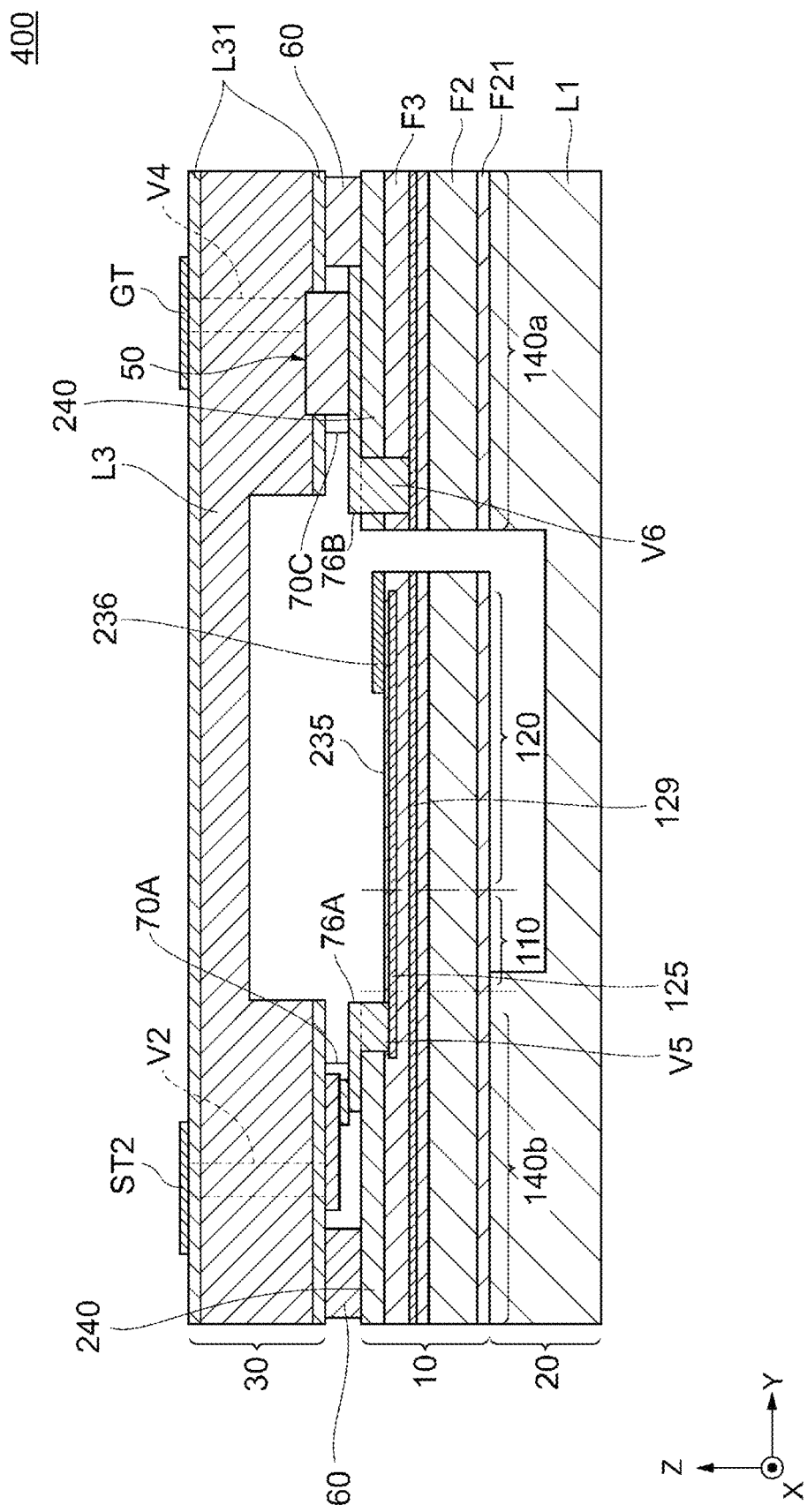
FIG. 10 is a cross-sectional view schematically illustrating a structure of a resonance device according to a fourth exemplary embodiment.

Next, referring to FIG. 10, a resonance device according to the fourth embodiment is described.

FIG. 10 is a cross-sectional view schematically illustrating a structure of a resonance device 400 according to the fourth embodiment. Note that FIG. 10 is a cross-sectional view along the Y-axis of the resonance device 400.

The resonance device 400 of the fourth embodiment is different from the resonance device 1 of the first embodiment and the resonance device 200 of the second embodiment in that a ground part 50 is provided therein.

As illustrated in FIG. 10, the contact electrode 76B extends over the stray capacitance reduction film 240 and is connected to part of the joint part 60, or the contact electrode 76B is formed together with part of the joint part 60 as a single body.

The ground part 50 comes into contact with the contact electrode 76B formed on the resonator 10 and is electrically connected to the lower electrode 129 via the contact electrode 76B. The ground part 50 is connected to the contact electrode 76B when eutectic bonding of the upper cover 30 and the resonator 10 is formed using the joint part 60.

At a location of the upper cover 30 where the ground part 50 is to be formed, the silicon oxide film L31 is removed by processing such as etching and the like, and the ground part 50 is formed on the exposed Si wafer L3. The ground part 50 is joined to the Si wafer L3 in such a manner as to form ohmic bonding therebetween by thermal annealing after forming a metal such as, for example, gold (Au), aluminum (Al), or the like on the Si wafer L3. This configuration allows the ground terminal GT and the ground part 50 to be electrically connected to each other via the Si wafer L3 of the upper cover 30. Furthermore, by joining the ground part 50 and the contact electrode 76B, the lower electrode 129 is electrically connected to the ground terminal GT. Accordingly, it also becomes possible to cancel a stray capacitance that can be formed due to the silicon oxide film L31 arranged between the joint part 60 and the Si wafer L3 of the upper cover 30.

Fifth Exemplary Embodiment

Figure 11:
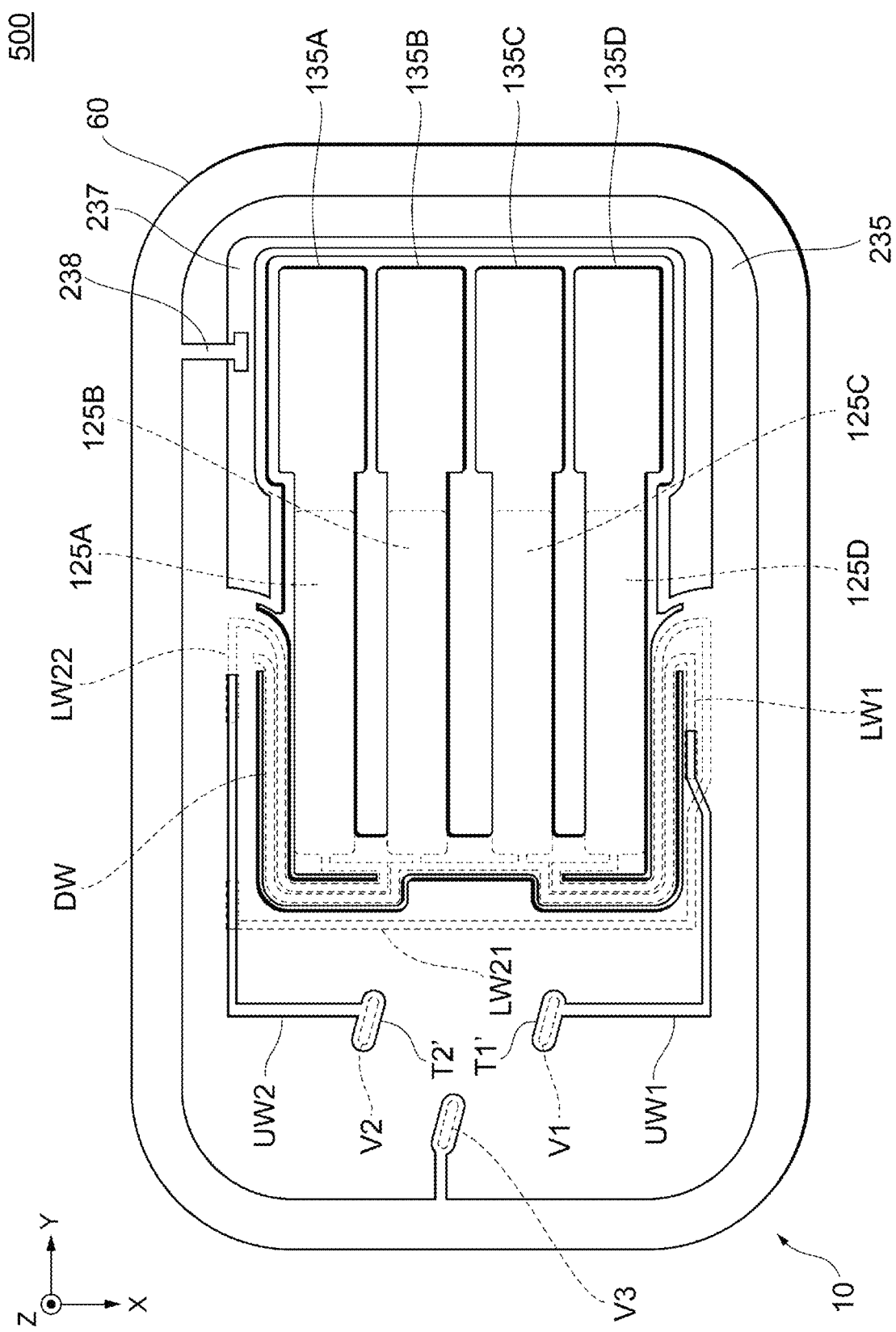
FIG. 11 is a plan view schematically illustrating a structure of a resonance device according to a fifth exemplary embodiment.

Next, referring to FIG. 11, a resonance device according to the fifth embodiment is described.

FIG. 11 is a plan view schematically illustrating a structure of a resonance device 500 according to the fifth embodiment. FIG. 11 is a plan view that corresponds to FIG. 6 in the first embodiment.

The resonance device 500 of the fifth embodiment is different from the resonance device 1 of the first embodiment and the resonance device 200 of the second embodiment in that the joint part 60 and the lower electrode 129 are electrically connected to each other by an electrically conductive part 237 and a wiring line 238.

As illustrated in FIG. 10, the electrically conductive part 237 is formed on the holding part 140 along an inner edge of the holding part 140. Specifically, the electrically conductive part 237 is provided at such a location where, in the plan view, an inner edge of the electrically conductive part 237 substantially matches an inner edge of the holding part 140 and an outer edge of the electrically conductive part 237 is positioned in between the inner edge and an outer edge of the holding part 140. The width from the inner edge to the outer edge of the electrically conductive part 237 is, for example, about 10 μm. Note that it is only necessary to form the electrically conductive part 237 at least in a maximum displacement area where the displacement of the vibration part 120 caused by vibration becomes maximum, that is to say, at least in an area that faces the open ends of the vibration arms 135.

Although it is not illustrated in the drawing, as is the case with the contact electrode 76B illustrated in FIG. 8, part of the electrically conductive part 237 is connected to the lower electrode 129 by removing parts of the piezoelectric thin film F3 and the stray capacitance reduction film 240 stacked on the lower electrode 129 and filling the inside of a formed via with the electrically conductive part 237.

The wiring line 238 is a wiring line routed from the joint part 60 to the electrically conductive part 237 and connects the joint part 60 and the electrically conductive part 237. Because of this, the joint part 60 and the lower electrode 129 are electrically connected and short-circuited via the wiring line 238 and the electrically conductive part 237, and thus it becomes possible to cancel a stray capacitance that can be formed due to the piezoelectric thin film F3 or the stray capacitance reduction film 240 arranged between the joint part 60 and the lower electrode 129.

Exemplary embodiments of the present invention have been described above. In a resonance device according to an exemplary embodiment, the area of a first power supply terminal and the area of a second power supply terminal are different from each other in such a way that the capacitance formed between the first power supply terminal and a ground terminal is approximately equal to the capacitance formed between the second power supply terminal and the ground terminal. This configuration reduces the absolute value of the difference between the capacitance formed between the first power supply terminal and the ground terminal and the capacitance formed between the second power supply terminal and the ground terminal. Accordingly, an imbalance between the capacitance formed between the first power supply terminal and the ground terminal and the capacitance formed between the second power supply terminal and the ground terminal can be suppressed.

Further, in the foregoing resonance device, the length of the first power supply terminal and the length of the second power supply terminal are different from each other. This configuration facilitates the realization of the first power supply terminal and the second power supply terminal that have different areas.

Further, in the foregoing resonance device, the width of the first power supply terminal and the width of the second power supply terminal are different from each other. This configuration facilitates the realization of the first power supply terminal and the second power supply terminal that have different areas.

Further, in the foregoing resonance device, the shape of the first power supply terminal and the shape of the second power supply terminal are different from each other. This configuration facilitates the realization of the first power supply terminal and the second power supply terminal that have different areas.

As noted above, the capacitance formed between the first power supply terminal and the ground terminal is approximately equal to the capacitance formed between the second power supply terminal and the ground terminal. In one exemplary aspect of the foregoing resonance device, the capacitance formed between the first power supply terminal and the ground terminal is in the range from −50% to +50% of the capacitance formed between the second power supply terminal and the ground terminal. This configuration allows to have a favorable oscillation, for example, even after reversing voltage signals applied to the first power supply terminal and the second power supply terminal.

Further, in the foregoing resonance device, the capacitance formed between the first power supply terminal and the ground terminal is preferably in the range from −20% to +20% of the capacitance formed between the second power supply terminal and the ground terminal. This configuration allows to have a more favorable oscillation, for example, even after reversing the voltage signals applied to the first power supply terminal and the second power supply terminal.

Further, in the foregoing resonance device, a dummy wiring line is included either in an upper wiring line and a lower wiring line that electrically connect the first power supply terminal and an upper electrode or in an upper wiring line and a lower wiring line that electrically connect the second power supply terminal and an upper electrode. This configuration enables to keep symmetry of vibrations of vibration arms and also enables to adjust an imbalance among the capacitances formed by the areas of the upper wiring line and the lower wiring line that electrically connect the first power supply terminal and the upper electrode and the areas of the upper wiring line and the lower wiring line that electrically connect the second power supply terminal and the upper electrode by using the area of the dummy wiring line.

Further, in the foregoing resonance device, a voltage signal applied to the first power supply terminal and a voltage signal applied to the second power supply terminal are in opposite phases. This configuration suppresses the capacitance imbalance and also facilitates the realization of a resonance device that vibrates in a flexural vibration mode.

Further, in the foregoing resonance device, a joint part is electrically connected to the lower electrode. Because of this configuration, the joint part and the lower electrode are short-circuited, and thus it becomes possible to cancel a stray capacitance that can be formed due to a piezoelectric thin film or a stray capacitance reduction film arranged between the joint part and the lower electrode. As a result, although this makes the resonance device more susceptible to the capacitance imbalance, as described above, it becomes possible to suppress influences caused by the capacitance imbalance by making the area of the first power supply terminal and the area of the second power supply terminal different from each other in such a way that the capacitance formed between the first power supply terminal and the ground terminal is approximately equal to the capacitance formed between the second power supply terminal and the ground terminal.

In general, it is noted that each of the exemplary embodiments described above is provided to facilitate understanding of the present invention and is not to be construed as limiting the present invention. The exemplary embodiments can be modified or improved without departing from its spirit, and the present invention also includes equivalents thereof. That is to say, ones obtained by suitably modifying designs of the respective embodiments by those skilled in the art are also included within the scope of the present invention as long as they include features of the present invention. For example, each element included in each embodiment as well as its arrangement, material, vibration mode, condition, shape, size, and the like are not limited to those exemplified, and may be suitably changed. Needless to say, each embodiment is for illustrative purposes only, and constituent elements illustrated in different embodiments may be combined or partially exchanged, which are also included in the scope of the present invention so long as the characteristic features of the present invention are included.

REFERENCE SIGNS LIST

1: Resonance device, 10: Resonator, 20: Lower cover, 21: Depression part, 22: Bottom plate, 23: Side wall, 30: Upper cover, 31: Depression part, 33: Side wall, 60: Joint part, 70A, 70C: Connection wiring line, 76A, 76B: Contact electrode, 110: Holding arm, 120: Vibration part, 125, 125A, 125B, 125C, 125D: Upper electrode, 129: Lower electrode, 130: Base part, 131*a*: Long side, 131A: Front end, 131*b*: Long side, 131B: Back end, 131*c*: Short side, 131*d*: Short side, 135, 135A, 135B, 135C, 135D: Vibration arm, 140: Holding part, 235: Protective film, 236: Frequency adjustment film, CL: Electrically conductive layer, DW: Dummy wiring line, F2: Si substrate, F3: Piezoelectric thin film, G: Weight part, GT: Ground terminal, GW: Ground wiring line, L1, L3: Si wafer, L31: Silicon oxide film, LN1: Power supply wiring line, LN3: Ground wiring line, LW1: Lower wiring line, LW21, LW22: Lower wiring line, P: Hypothetical plane, PD1: Power supply pad, PD2: Power supply pad, PD3, PD4: Ground pad, ST1: Power supply terminal, ST2: Power supply terminal, T1', T2': Terminal, UW1: Upper wiring line, UW2: Upper wiring line, V1, V2, V3: Penetration electrode.

The invention claimed is:
1. A resonance device comprising:
a resonator including three or more upper electrodes, a lower electrode, and a piezoelectric film disposed between the three or more upper electrodes and the lower electrode;
a substrate constructed to have a first surface that faces the three or more upper electrodes of the resonator;
a first power supply terminal disposed on a second surface of the substrate opposite the first surface, with the first power supply terminal being electrically connected to a first upper electrode of the three or more upper electrodes;
a second power supply terminal disposed on the second surface and electrically connected to a second upper electrode of the three or more upper electrodes other than the first upper electrode connected to the first power supply terminal; and
a ground terminal disposed on the second surface and electrically connected to the lower electrode, wherein respective areas of the first and second power supply terminals are different from each other, such that a capacitance formed between the first power supply terminal and the ground terminal is approximately equal to a capacitance formed between the second power supply terminal and the ground terminal.

2. The resonance device according to claim 1, wherein the first power supply terminal has a length that is different than a length of the second power supply terminal.

3. The resonance device according to claim 1, wherein the first power supply terminal has a width that is different than a width of the second power supply terminal.

4. The resonance device according to claim 1, wherein the first power supply terminal comprises a shape in a plan view of the second surface of the substrate that is different than a shape of the second power supply terminal in the plan view.

5. The resonance device according to claim 1, wherein the resonator comprises a base and at least three vibration arms extending from the base, with the three or more upper electrodes disposed on the at least three vibration arms, respectively.

6. The resonance device according to claim 5,
wherein the first power supply terminal is electrically connected to a respective upper electrode disposed on an inner vibration arm of the at least three vibration arms, and
wherein the second power supply terminal is electrically connected to the upper electrodes respectively disposed on outer vibration arms of the at least three vibration arms.

7. The resonance device according to claim 1, further comprising:
a first wiring line that electrically connects the first power supply terminal to the first upper electrode; and
a second wiring line that electrically connects the second power supply terminal to the second upper electrode.

8. The resonance device according to claim 7, wherein one of the first wiring line and the second wiring line includes a dummy wiring line to increase an area of the respective wiring line.

9. The resonance device according to claim 8, wherein the dummy wiring line forms a symmetrical line pattern between the first and second wiring lines.

10. The resonance device according to claim 1, wherein a voltage signal applied to the first power supply terminal and a voltage signal applied to the second power supply terminal are in opposite phases.

11. The resonance device according to claim 1, further comprising a joint part that joins the resonator to the substrate and is electrically connected to the lower electrode.

12. The resonance device according to claim 11, further comprising:
a protective film that covers the resonator; and
a stray capacitance reduction film stacked on the protective film and coupled directly to the joint part.

13. The resonance device according to claim 1, wherein the respective areas of the first and second power supply terminals are surface areas view in a plan view of the second surface of the substrate.

14. A resonance device comprising:
a resonator including a plurality of upper electrodes, a lower electrode, and a piezoelectric film disposed between the upper electrodes and the lower electrode;
a substrate having a first surface that faces the plurality of upper electrodes of the resonator;
a first power supply terminal disposed on a second surface of the substrate opposite the first surface, with the first power supply terminal being electrically connected to a first upper electrode of the plurality of upper electrodes;
a second power supply terminal disposed on the second surface of the substrate and being electrically connected to a second upper electrode of the plurality of upper electrodes; and
a ground terminal disposed on the second surface and electrically connected to the lower electrode,
wherein an area of the first power supply terminal relative to a plan view of the second surface is different than an area of the second power supply terminal relative to the plan view, such that a capacitance formed between the first power supply terminal and the ground terminal is in a range from −50% to +50% of a capacitance formed between the second power supply terminal and the ground terminal.

15. The resonance device according to claim 14, wherein the capacitance formed between the first power supply terminal and the ground terminal is 6.5 pF and the capacitance formed between the second power supply terminal and the ground terminal is 7.3 pF.

16. The resonance device according to claim 14, wherein the first power supply terminal comprises a shape in the plan view of the second surface of the substrate that is different than a shape of the second power supply terminal in the plan view.

17. The resonance device according to claim 14, further comprising:
a first wiring line that electrically connects the first power supply terminal to the first upper electrode; and
a second wiring line that electrically connects the second power supply terminal to the second upper electrode,
wherein one of the first wiring line and the second wiring line includes a dummy wiring line.

18. The resonance device according to claim 14, wherein the capacitance formed between the first power supply terminal and the ground terminal is in a range from −20% to +20% of the capacitance formed between the second power supply terminal and the ground terminal.

* * * * *